(12) United States Patent
Takami

(10) Patent No.: US 7,750,396 B2
(45) Date of Patent: Jul. 6, 2010

(54) SEMICONDUCTOR DEVICE AND METHOD FOR FABRICATING THE SAME

(75) Inventor: Yoshinori Takami, Kyoto (JP)

(73) Assignee: Panasonic Corporation, Osaka (JP)

( * ) Notice: Subject to any disclaimer, the term of this patent is extended or adjusted under 35 U.S.C. 154(b) by 9 days.

(21) Appl. No.: 11/438,385

(22) Filed: May 23, 2006

(65) Prior Publication Data
US 2007/0069285 A1    Mar. 29, 2007

(30) Foreign Application Priority Data
Sep. 26, 2005 (JP) .............................. 2005-277166

(51) Int. Cl.
*H01L 29/76* (2006.01)
(52) U.S. Cl. ...................... 257/327; 257/324; 257/410; 257/E29.242; 257/328; 257/329; 257/330; 257/331; 257/332; 257/333; 257/334; 257/335; 257/336; 257/337; 257/340; 257/341; 257/342; 257/343; 257/344; 257/345; 257/346
(58) Field of Classification Search ................. 257/327, 257/324, 328–346, 410, E29.242
See application file for complete search history.

(56) References Cited

U.S. PATENT DOCUMENTS 6,909,156 B2 * 6/2005 Aoyama ..................... 257/410

7,071,038 B2 * 7/2006 Triyoso et al. .............. 438/151
2002/0163039 A1 * 11/2002 Clevenger et al. ........... 257/340
2004/0056301 A1 * 3/2004 Ahmed et al. ............... 257/327

FOREIGN PATENT DOCUMENTS

JP    2003-69011 A    3/2003
JP    2004-186295 A    7/2004

* cited by examiner

*Primary Examiner*—Cuong Q Nguyen
*Assistant Examiner*—Trang Q Tran
(74) *Attorney, Agent, or Firm*—McDermott Will & Emery LLP

(57) ABSTRACT

A semiconductor device includes: a semiconductor substrate; a source region and a drain region formed in the upper part of the semiconductor substrate so as to be spaced; a channel region formed in a part of the semiconductor substrate between the source region and the drain region; a first dielectric film formed on the channel region of the semiconductor substrate; a second dielectric film formed on the first dielectric film and having a higher permittivity than the first dielectric film; a third dielectric film formed on at least an end surface of the second dielectric film near the drain region out of end surfaces of the second dielectric film near the source and drain regions; and a gate electrode formed on the second dielectric film and the third dielectric film.

10 Claims, 10 Drawing Sheets

US 7,750,396 B2

SEMICONDUCTOR DEVICE AND METHOD FOR FABRICATING THE SAME

CROSS-REFERENCE TO RELATED APPLICATIONS

The disclosure of Japanese Patent Application No. 2005-277166 filed on Sep. 26, 2005 including specification, drawings and claims is incorporated herein by reference in its entirety.

BACKGROUND OF THE INVENTION (1) Field of the Invention

The present invention relates to semiconductor devices and methods for fabricating the same, and more particularly relates to semiconductor devices having field-effect transistors using high-dielectric-constant films as gate dielectrics and methods for fabricating the same.

(2) Description of Related Art

With an increasing degree of integration and operation speed of large scale integrated circuits (LSIs), metal insulator semiconductor (MIS) transistors serving as elementary elements of circuits have conventionally become finer according to the scaling law. When the dimensions of a MIS transistor, such as the gate length of a gate electrode thereof and the thickness of a gate dielectric thereof, are simultaneously miniaturized according to the scaling law, this can enhance the electrical characteristics of the MIS transistor. For example, in a case where the gate length of the gate electrode is set at 0.1 µm or less, the gate dielectric needs to have an equivalent oxide thickness (EOT) of approximately 2 nm or less.

However, in a case where a known gate dielectric made of silicon dioxide ($SiO_2$) has a thickness of 2 nm or less, the leakage current due to a direct tunnel current passing through the gate dielectric increases, leading to the increased power consumption of an LSI. To cope with this, in recent years, a technique in which a high-dielectric-constant (high-k) film is used as a material of a gate dielectric has been suggested.

High-dielectric-constant materials typically represent dielectric materials having a higher dielectric constant than $SiO_2$ having a dielectric constant of approximately 4 and include hafnium dioxide ($HfO_2$), zirconium dioxide ($ZrO_2$) or aluminum oxide ($Al_2O_3$). When such a high-dielectric-constant material is used for a gate dielectric, this allows the physical thickness of the gate dielectric to increase according to the amount of the dielectric constant increased. In view of the above, the leakage current produced due to the direct tunnel current can be reduced while the EOT of the gate dielectric is reduced.

MIS field-effect transistors using a high-dielectric-constant material as a material of gate dielectrics include those having a structure illustrated in FIG. 11 (see, for example, Japanese Unexamined Patent Publication No. 2003-69011). As illustrated in FIG. 11, a gate dielectric 104 composed of a first dielectric film 102 of $SiO_2$ or SiON and a second dielectric film 103 of $HfO_2$ is formed on a semiconductor substrate 101 made of silicon. A gate electrode 105 of doped polysilicon is formed on a part of the gate dielectric 104, and insulative sidewalls 106 are formed on parts of the top surface of the gate dielectric 104 located to both sides of the gate electrode 105. A source region 107 and a drain region 108 are formed in regions of the semiconductor substrate 101 located to both sides of the gate electrode 105 by impurity implantation. A channel region 109 is formed in a region of the semiconductor substrate 101 located under the gate dielectric 104 and between the source region 107 and the drain region 108.

This structure ensures that the gate dielectric 104 has an EOT of 2 nm or less. This can reduce the leakage current produced due to the direct tunnel current and prevent generation of fixed charges in the channel region 109 and deterioration in the mobility of carriers therein. As a result, the consumed power of the MIS transistor can be reduced and the current allowed to pass through the MIS transistor can be increased.

However, the known MIS transistor whose gate electrode 104 contains a high-dielectric-constant material has the following problems.

FIG. 12 illustrates a simulation result of an electric field intensity distribution in the channel region 109 along the line A-B in FIG. 11. Voltages are applied to a transistor under the following conditions: the gate voltage is 0 V and the drain voltage is 1 V. As obvious from FIG. 12, the electric field intensity in the semiconductor substrate 101 reaches its peak immediately below the end surface of the gate electrode 105 near the drain region 108 (GD).

FIG. 13 illustrates a result obtained by simulating, in the known MIS transistor illustrated in FIG. 11, the relationship between the EOT of the gate dielectric 104 and the maximum electric field intensity in the semiconductor substrate 101. FIG. 14 illustrates a result obtained by simulating, in the known MIS transistor illustrated in FIG. 11, the relationship between the EOT of the gate dielectric 104 and the leakage current flowing from the drain region 108 to the other region of the semiconductor substrate 101. In FIGS. 13 and 14, the gate length is 75 nm, the first dielectric film 102 has a thickness of 1 nm, the second dielectric film (high-dielectric-constant film) 103 has a thickness of 4 nm and different dielectric constants. Voltages are applied to the transistor under the following conditions: the gate voltage corresponding to the OFF state of the transistor is 0 V and the drain voltage is 1V.

As obvious from FIG. 13, the maximum electric field intensity in the semiconductor substrate 101 becomes higher with a decrease in the EOT of the gate dielectric 104. The reason for this is that the dielectric constant of the gate dielectric 104 is increased with a decrease in the EOT of the gate dielectric 104. As obvious from FIG. 14, the drain-to-substrate leakage current increases with a decrease in the EOT of the gate dielectric 104. The reason for this is that as illustrated in FIG. 13, the maximum electric field intensity in the semiconductor substrate 101 increases with a decrease in the EOT of the gate dielectric 104.

FIG. 15 illustrates a result obtained by simulating, in the known MIS transistor illustrated in FIG. 11, the relationship between the EOT of the gate dielectric 104 and the parasitic capacitance. In FIG. 15, the parasitic capacitance represents the mean value of the parasitic capacitances of the transistor corresponding to the ON and OFF states thereof. The gate length is 75 nm, the first dielectric film 102 has a thickness of 1 nm, and the second dielectric film 103 has a thickness of 4 nm and different dielectric constants. The operating frequency of the transistor is 10 MHz, and voltages are applied to the transistor under the following conditions: When the transistor is in an OFF state, the gate voltage is 0 V and the drain voltage is 1 V; and when the transistor is in an ON state, the gate voltage is 1V and the drain voltage is 1 V. As obvious from FIG. 15, the parasitic capacitance increases with a decrease in the EOT of the gate dielectric 104. The reason for this is that the capacitance of the transistor is proportional to the permittivity of the gate dielectric 104.

In view of the above, in a known MIS semiconductor device represented by that illustrated in FIG. 11, the electric field intensity increases in a part of a channel region located immediately below the end surface of a gate electrode near a drain with a decrease in the EOT of a gate dielectric. This increases the leakage current generated in the transistor, resulting in the increased power consumption. Furthermore, since the parasitic capacitance of the transistor increases with a decrease in the EOT, this prevents the operation speed of devices from increasing.

SUMMARY OF THE INVENTION

The present invention is made to solve the above conventional problems, and its object is to provide a semiconductor device that uses a high-dielectric-constant material as a material of a gate dielectric and allows reduction in the leakage current and the parasitic capacitance.

In order to achieve the above object, a semiconductor device of the present invention is configured such that a dielectric film having a lower permittivity than a high-dielectric-constant material forming a gate dielectric is provided on at least the end surface of the gate dielectric near a drain and between a semiconductor substrate and a gate electrode.

To be specific, a semiconductor device of the present invention includes: a semiconductor substrate; a source region and a drain region formed in the upper part of the semiconductor substrate so as to be spaced; a channel region formed in a part of the semiconductor substrate between the source region and the drain region; a first dielectric film formed on the channel region of the semiconductor substrate; a second dielectric film formed on the first dielectric film and having a higher permittivity than the first dielectric film; a third dielectric film formed on at least an end surface of the second dielectric film near the drain region out of end surfaces thereof near the drain and source regions; and a gate electrode formed on the second dielectric film and the third dielectric film.

According to the semiconductor device of the present invention, the third dielectric film having a lower permittivity than the second dielectric film is formed under the gate electrode and on the end surface of the second dielectric film near the drain region out of the end surfaces of the second dielectric film near the source and drain regions. This reduces the concentration of electric field on part of the semiconductor substrate (channel region) located below at least the end surface of the gate electrode near the drain region. As a result, the leakage current during the OFF state of the semiconductor device can be reduced, resulting in reduced power consumption. Furthermore, since the third dielectric film having a lower permittivity than the second dielectric film forms part of the gate dielectric, this reduces the parasitic capacitance, resulting in the increased operation speed.

In the semiconductor device of the present invention, the third dielectric film is preferably formed also on the associated side of the gate electrode.

In the semiconductor device of the present invention, the thickness of the third dielectric film located between the gate electrode and the semiconductor substrate is preferably larger than the sum of the thicknesses of the first and second dielectric films.

In the semiconductor device of the present invention, at least one end portion of the drain region near the channel region out of end portions of the source and drain regions near the channel region is preferably located below the gate electrode and under the third dielectric film.

In the semiconductor device of the present invention, the second dielectric film preferably contains at least one of hafnium dioxide, zirconium dioxide and aluminum oxide.

In the semiconductor device of the present invention, the third dielectric film preferably contains silicon and at least one of oxygen and nitrogen.

A method for fabricating a semiconductor device of the present invention includes the steps of: (a) sequentially forming, on a semiconductor substrate, a first dielectric film and a second dielectric film having a higher permittivity than the first dielectric film; (b) forming a gate electrode on the second dielectric film; (c) after the step (b), etching away a part of the second dielectric film located under at least one of both end portions of the gate electrode in the gate length direction, thereby forming a gap between the at least one of both end portions of the gate electrode and the semiconductor substrate; (d) forming, in the gap, a third dielectric film having a lower permittivity than the second dielectric film; and (e) after the step (d), implanting ions into regions of the semiconductor substrate located to both sides of the gate electrode using the gate electrode as a mask, thereby forming a source region and a drain region.

According to the method for fabricating a semiconductor device of the present invention, a part of the second dielectric film located under at least one of both end portions of the gate electrode in the gate length direction is etched away, thereby forming a gap between the at least one of both end portions of the gate electrode and the semiconductor substrate. Thereafter, the third dielectric film having a lower permittivity than the second dielectric film is formed in the formed gap. In this way, the semiconductor device of the present invention can be provided. This can reduce the leakage current and the parasitic capacitance.

In the method of the present invention, in the step (c), the gap is preferably formed in at least an end portion of the second dielectric film near a region of the semiconductor substrate that will form the drain region.

In the method of the present invention, it is preferable that in the step (c), a part of the first dielectric film located under the gap is also etched away.

In the method of the present invention, it is preferable that in the step (c), part of the upper part of the semiconductor substrate located under the gap is also etched away.

In the method of the present invention, in the step (a), a dielectric material containing at least one of hafnium dioxide, zirconium dioxide and aluminum oxide is preferably used for the second dielectric film.

In the method of the present invention, in the step (d), a dielectric material containing silicon and at least one of oxygen and nitrogen is preferably used for the third dielectric film.

In the method of the present invention, in the step (d), offset spacers forming parts of the third dielectric film are preferably formed on both sides of the gate electrode in the formation of the third dielectric film.

DETAILED DESCRIPTION OF THE INVENTION

Embodiment 1

A first embodiment of the present invention will be described with reference to the drawings.

Figure 1:
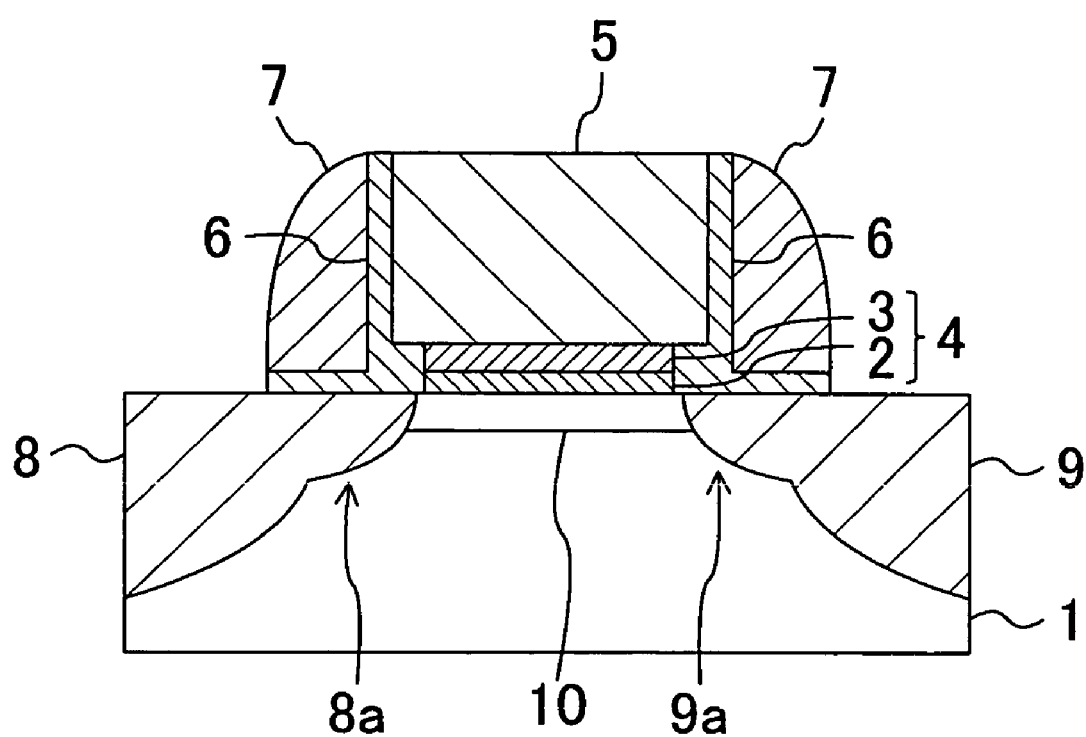
FIG. 1 is a cross-sectional view illustrating the structure of a semiconductor device according to a first embodiment of the present invention.

FIG. 1 illustrates a cross-sectional structure of a semiconductor device according to the first embodiment of the present invention. As illustrated in FIG. 1, a gate dielectric 4 composed of a first dielectric film 2 of silicon containing at least one of oxygen and nitrogen and a second dielectric film 3 of a high-dielectric-constant material, such as hafnium dioxide ($HfO_2$), is formed on a part of a semiconductor substrate 1 made of, for example, silicon. A gate electrode 5 of doped polysilicon is formed on the gate dielectric 4 such that its both end portions in the gate length direction extend, like eaves, beyond the gate dielectric 4.

Third dielectric films 6 having a lower dielectric constant than the second dielectric film 3 and serving as offset spacers of, for example, silicon containing at least one of oxygen and nitrogen are formed, as spacer films, to cover both sides of the gate electrode 5 in the gate length direction and both lateral end surfaces of the gate dielectric 4. In the first embodiment, the end surfaces of both the first and second dielectric films 2 and 3 forming the gate dielectric 4 are located closer to the middle of the semiconductor device than both sides of the gate electrode 5. However, the end surfaces of at least the second dielectric film 3 need only be located closer to the middle of the semiconductor device than both sides of the gate electrode 5.

The first dielectric film 2 and the third dielectric films 6 may be made of the same material or different materials. For example, silicon dioxide ($SiO_2$), trisilicon tetranitride ($Si_3N_4$), and silicon oxynitride (SiON) can be used for the first and third dielectric films 2 and 6. A high temperature oxide (HTO) film that will be formed at a relatively high temperature can be used as silicon dioxide.

Zirconium dioxide ($ZrO_2$) having a dielectric constant of approximately 11 through 18.5 or aluminum oxide ($Al_2O_3$) having a dielectric constant of approximately 8.5 through 10 can be used, instead of $HfO_2$ having a dielectric constant of approximately 24, for the second dielectric film 3 made of a high-dielectric-constant material. The second dielectric film 3 may be a single-layer film of $HfO_2$ or a multilayer film made of a combination of $HfAlO_2$ and $HfO_2$, a combination of $HfAlO_2$, $HfO_2$ and $HfAlO_2$, or any other combination.

Insulative sidewalls 7 are formed on the respective surfaces of the third dielectric films 6 opposite to the gate electrode 5 and the gate dielectric 4. Parts of the third dielectric films 6 located between the sidewalls 7 and the semiconductor substrate 1 does not always need to be provided.

A source region 8 and a drain region 9 are formed, by impurity implantation, in regions of the semiconductor substrate 1 located to both sides of the gate electrode 5. A channel region 10 is formed in a region of the semiconductor substrate 1 located under the gate dielectric 4 and between the source region 8 and the drain region 9. Respective end portions of the source region 8 and the drain region 9 near the channel region 10 form extension regions 8a and 9a.

A fabrication method for the semiconductor device formed as mentioned above will be described with reference to the drawings.

FIGS. 2A through 3C are cross-sectional views illustrating process steps in a fabrication method for a semiconductor device according to the first embodiment of the present invention step by step.

Figure 2A:
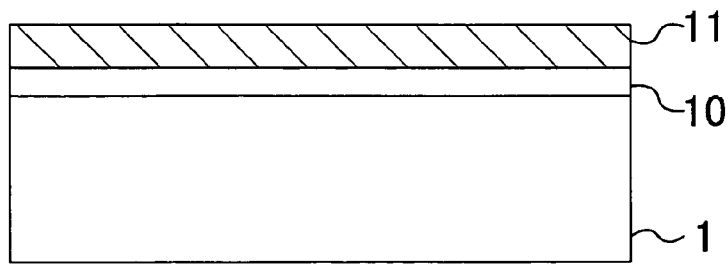
FIGS. 2A through 2D are cross-sectional views illustrating some of process steps in a fabrication method for a semiconductor device according to the first embodiment of the present invention step by step.

First, as illustrated in FIG. 2A, a 15-nm-thick sacrificial oxide film 11 is formed on the principal surface of a semiconductor substrate 1 made of silicon by thermal oxidation. Thereafter, a P-type channel region 10 is formed in the top surface of the semiconductor substrate 1 in the following manner: P-type impurity ions, such as boron (B) ions, are implanted through the sacrificial oxide film 11 into the semiconductor substrate 1 to adjust the threshold voltage of the semiconductor device, and subsequently the entire substrate region is subjected to heat treatment, thereby activating the implanted impurity ions.

Figure 2B:
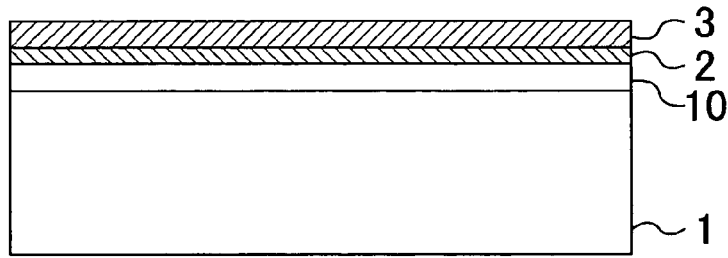

Next, as illustrated in FIG. 2B, the sacrificial oxide film 11 is removed by wet etching using an aqueous solution containing hydrofluoric acid (HF). Thereafter, the semiconductor substrate 1 is oxidized by heat treatment in an oxidizing atmosphere, for example, at a temperature of approximately 1000° C. In this way, a 1-nm-thick first dielectric film 2 made of silicon dioxide ($SiO_2$) is formed on the principal surface of the semiconductor substrate 1. Subsequently, a 4-nm-thick second dielectric film 3 made of $HfO_2$ is formed on the first dielectric film 2 by metal organic chemical vapor deposition (MOCVD).

Figure 2C:
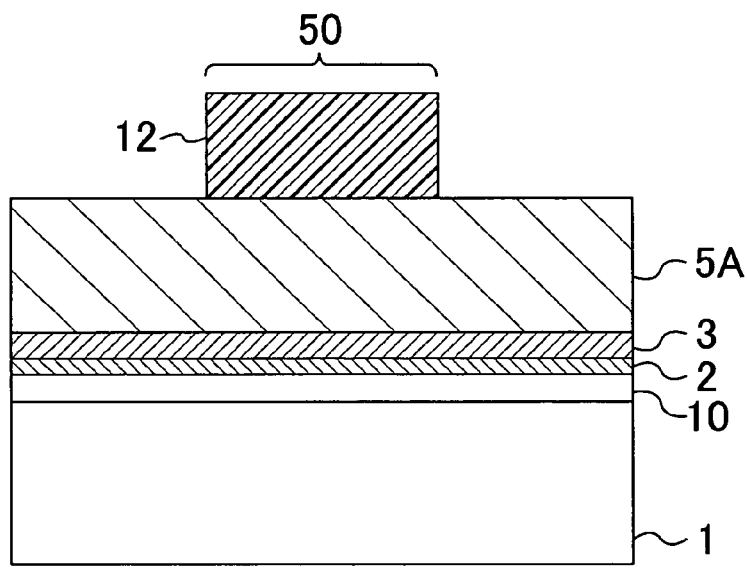

Next, as illustrated in FIG. 2C, a conductive film 5A that will partly form a gate electrode is formed on the second dielectric film 3. In this embodiment, 150-nm-thick polysilicon doped with phosphorus (P) is used as a material of the conductive film 5A. Thereafter, a resist material is applied onto the conductive film 5A, and thus a resist pattern 12 is formed by lithography to cover a part of the conductive film 5A corresponding to a region 50 in which a gate is to be formed (hereinafter, referred to as "gate formation region 50").

Figure 2D:
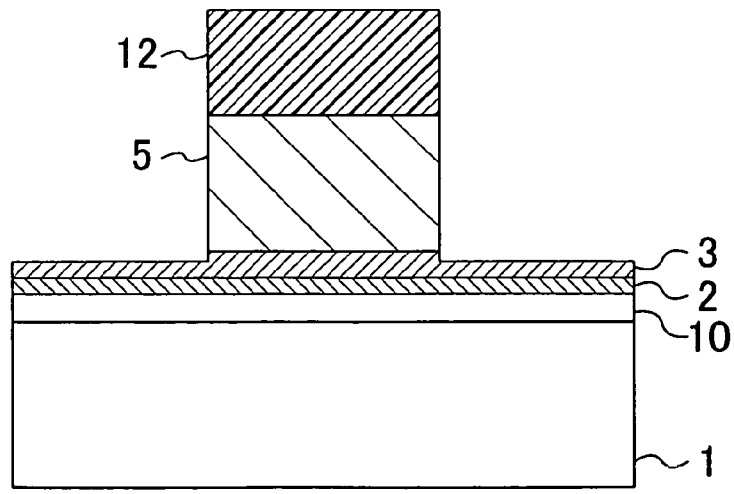

Next, as illustrated in FIG. 2D, the conductive film 5A is subjected to dry etching using an etching gas having, as the main ingredient, dichlorine ($Cl_2$) or hydrogen bromide (HBr) and using the formed resist pattern 12 as a mask. In this way, a gate electrode 5 is formed of the conductive film 5A. In this dry etching process step, the second dielectric film 3 is used as an etching stopper. In this process step, part of the second dielectric film 3 excluding part thereof corresponding to the gate formation region 50 and part of the first dielectric film 2 excluding the part thereof corresponding to the gate formation region 50 may be removed.

Figure 3A:
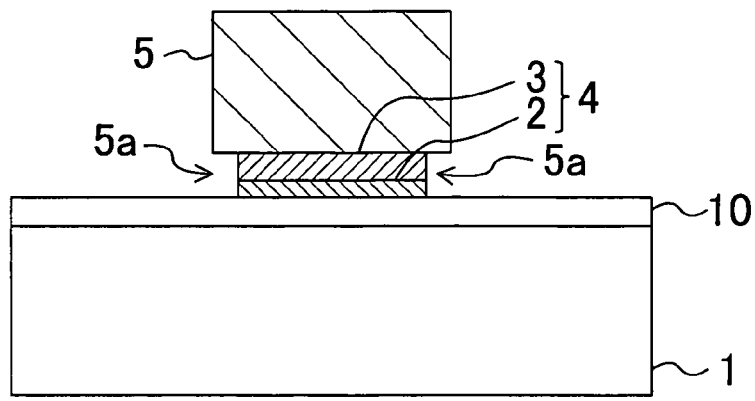
FIGS. 3A through 3C are cross-sectional views illustrating some of process steps in the fabrication method for a semiconductor device according to the first embodiment of the present invention.

Next, as illustrated in FIG. 3A, the resist pattern 12 is removed by ashing using oxygen plasma. Then, parts of the first and second dielectric films 2 and 3 located between both end portions of the gate electrode 5 in the gate length direction and the semiconductor substrate 1 are removed by isotropic wet etching using an aqueous solution containing hydrofluoric acid. In this way, gaps 5a are formed between both end portions of the gate electrode 5 in the gate length direction and the semiconductor substrate 1 (channel region 10). Simultaneously, a gate dielectric 4 is formed under the gate electrode 5 by removing both end portions of the first and second dielectric films 2 and 3 in the gate length direction.

Figure 3B:
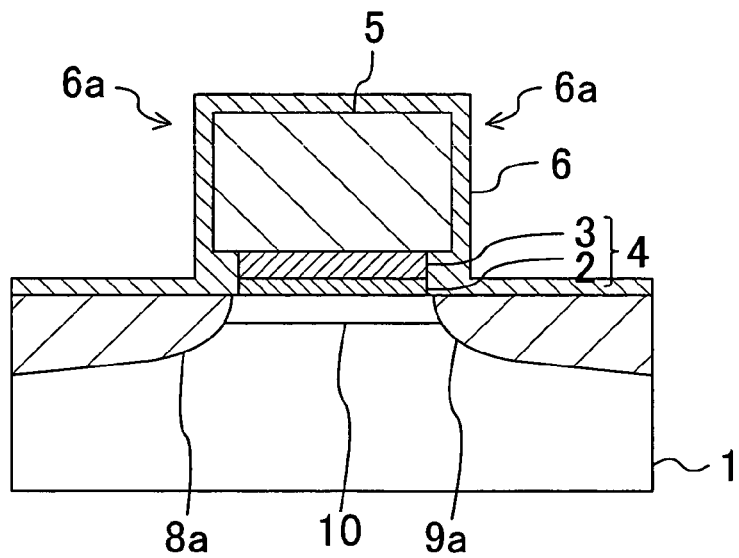

Next, as illustrated in FIG. 3B, a 5-nm-thick third dielectric film 6 of silicon dioxide (high-temperature oxide (HTO)) is formed, for example, by thermal chemical vapor deposition (CVD) at a temperature of approximately 700° C., to cover the top and side surfaces of the gate electrode 5, both lateral end surfaces of the gate dielectric 4 exposed at the gaps 5a and the principal surface of the semiconductor substrate 1. Since the HTO has excellent step coverage, a third dielectric film 6 is formed to efficiently fill the gaps 5a between the gate electrode 5 and the semiconductor substrate 1. Parts of the third dielectric film 6 located on both sides of the gate electrode 5 can be used as offset spacer films 6a. Subsequently, arsenic (As) ions are implanted, using the gate electrode 5 and the offset spacer films 6a as masks, into the semiconductor substrate 1 in a substantially vertical direction to the substrate surface, for example, at an implantation energy of 4 keV and an implant dose of $1 \times 10^{15}/cm^2$. In this way, extension regions 8a and 9a are formed in regions of the semiconductor substrate 1 located to both sides of the gate electrode 5, respectively. In this embodiment, ions are implanted into the semiconductor substrate 1 to form the extension regions 8a and 9a while the third dielectric film 6 is left on the semiconductor substrate 1. However, before this ion implantation, parts of the third dielectric film 6 that do not function as the offset spacer films 6a may be removed by anisotropic etching.

Figure 3C:
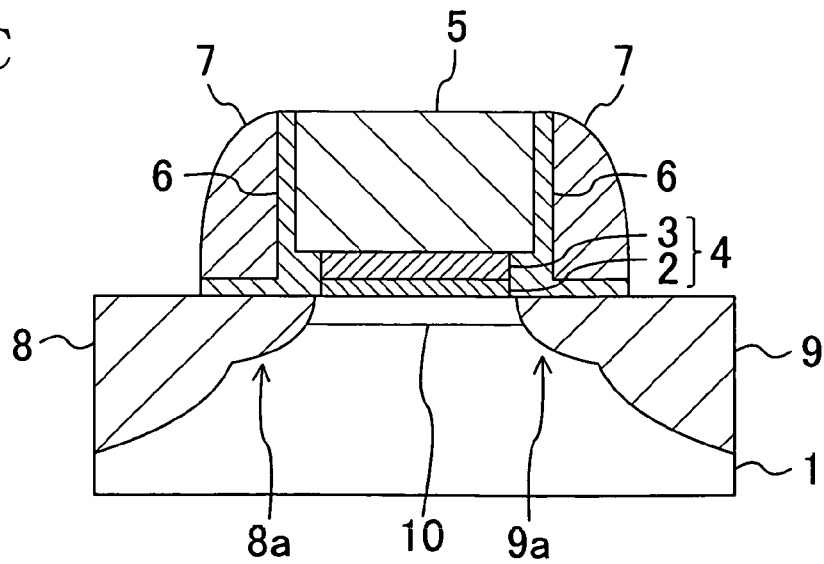

Next, as illustrated in FIG. 3C, a trisilicon tetranitride ($Si_3N_4$) film is formed by low pressure CVD to cover the third dielectric film 6. Then, sidewalls 7 of trisilicon tetranitride are formed on both sides of the gate electrode 5 in the manner in which the trisilicon tetranitride film is subjected to an etch-back process using dry etching. The exposed parts of the third dielectric film 6 are subjected to an etch-back process using dry etching. In this way, generally L-shaped third dielectric films 6 (partly forming offset spacer films 6a) serving as spacer films are formed between the gate electrode 5 and the sidewalls 7 and between the sidewalls 7 and the semiconductor substrate 1. In a case where in the process step illustrated in FIG. 3B, respective parts of the third dielectric films 6 that do not function as offset spacer films 6a are removed by anisotropic etching before ion implantation, the third dielectric films 6 do not need to be subjected to an etch-back process using dry etching after the formation of the sidewalls 7. Generally I-shaped third dielectric films 6 serving as spacer films are formed between the gate electrode 5 and the sidewalls 7. Subsequently, As ions are implanted, using the gate electrode 5, the third dielectric films 6 (the offset spacer films 6a) and sidewalls 7 as masks, into the semiconductor substrate 1 in a substantially vertical direction to the substrate surface, for example, at an implantation energy of 20 keV and an implant dose of $4 \times 10^{15}/cm^2$. Thereafter, the entire substrate region is subjected to heat treatment at a temperature of 1000° C. for three seconds, thereby activating the implanted As ions. In this way, a source region 8 and a drain region 9 are formed in regions of the semiconductor substrate 1 located to the respective outer sides of the sidewalls 7 to become continuous with extension regions 8a and 9a forming parts of the source and drain regions 8 and 9, respectively. In this way, the semiconductor device illustrated in FIG. 1 can be formed.

When in the process step illustrated in FIG. 3A a material having a sharply different etching selectivity from the first dielectric film 2, that is, a material achieving a higher etch rate than the first dielectric film 1, is used for the second dielectric film 3 of a high-dielectric-constant material, this allows formation of gaps 5a only in the second dielectric film 3.

Alternatively, only the top surface of the gate electrode 5 may be selectively exposed, and then a metal film of nickel (Ni), cobalt (Co) or any other metal may be deposited thereon. Thereafter, a combination of the deposited metal film and polysilicon forming the gate electrode 5 may be fully silicided (FUSI) to serve as a gate electrode 5.

The electrical characteristics of the semiconductor device according to the first embodiment will be described hereinafter with reference to the drawings.

Figure 4:
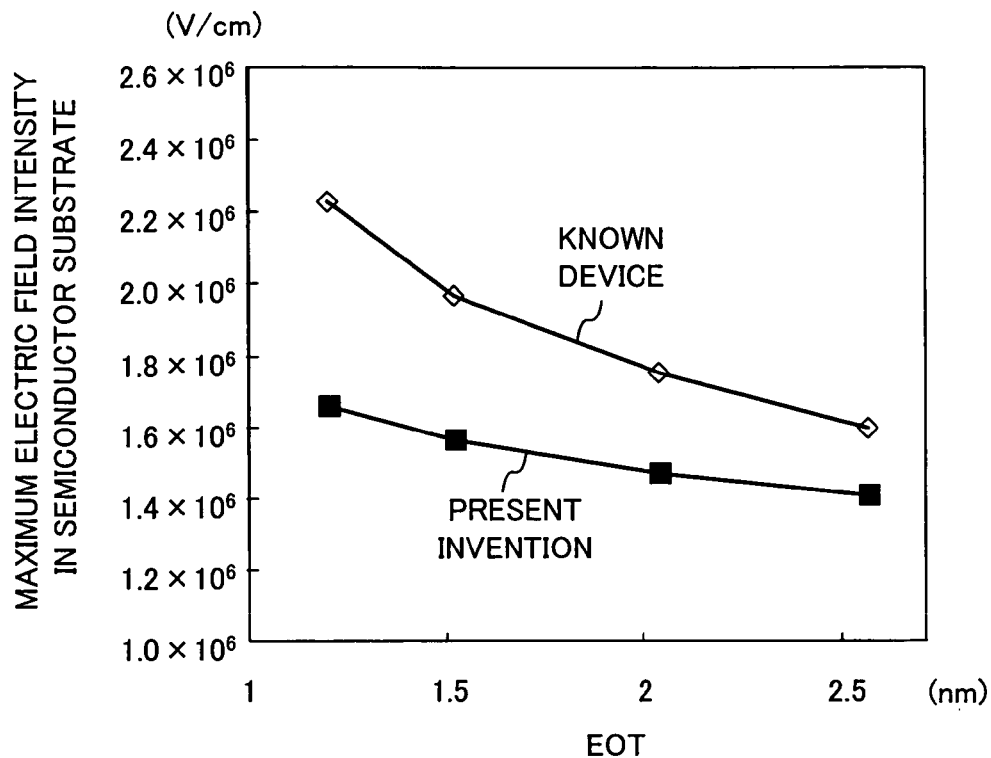
FIG. 4 is a graph obtained by simulating, in each of the semiconductor device of the first embodiment and a known semiconductor device, the relationship between the EOT thereof and the maximum electric field intensity thereof in a semiconductor substrate.
Figure 5:
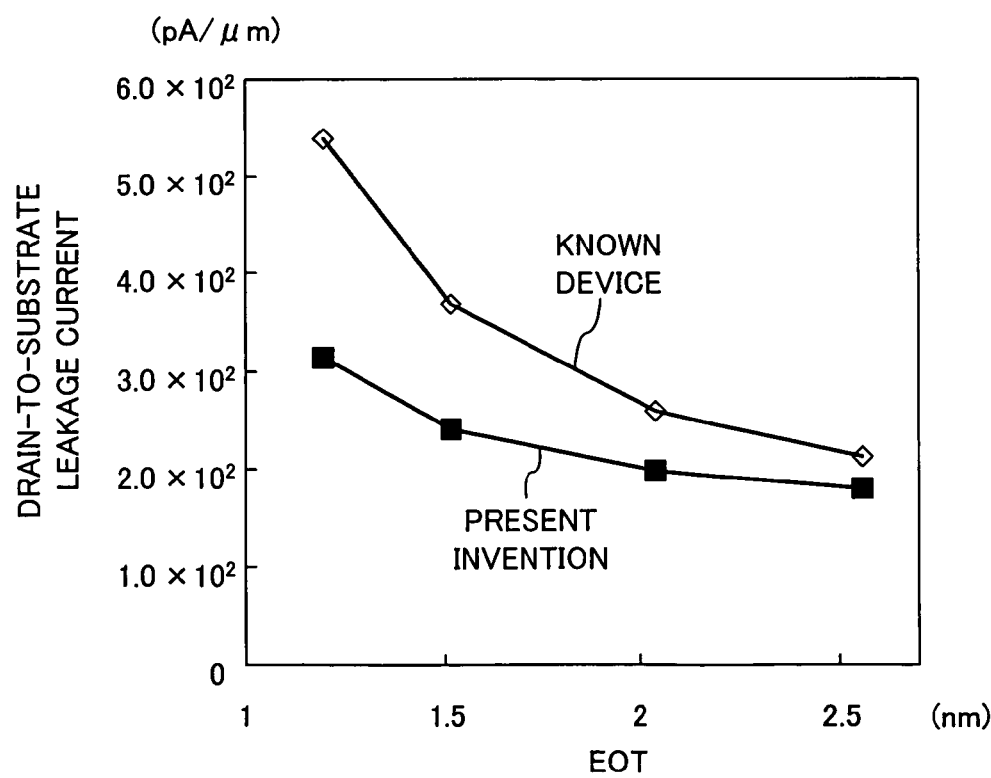
FIG. 5 is a graph obtained by simulating, in each of the semiconductor device of the first embodiment and the known semiconductor device, the relationship between the EOT thereof and the drain-to-substrate leakage current thereof.

FIG. 4 illustrates a result obtained by simulating, in each of the semiconductor device of the first embodiment and a known semiconductor device, the relationship between the EOT of a gate dielectric and the maximum electric field intensity in a semiconductor substrate. FIG. 5 illustrates a result obtained by simulating, in each of the semiconductor device of the first embodiment and the known semiconductor device, the relationship between the EOT of a gate dielectric and a leakage current flowing from a drain region to the other region of the semiconductor substrate. In FIGS. 4 and 5, the gate length of each semiconductor device is 75 nm, a first dielectric film thereof has a thickness of 1 nm, and a second dielectric film (high-dielectric-constant film) thereof has a thickness of 4 nm and different dielectric constants. Voltages are applied to the transistors under the following conditions: the gate voltage corresponding to the OFF state of each transistor is 0 V and the drain voltage is 1 V.

As illustrated in FIG. 4, in the semiconductor device according to the first embodiment (the present invention), the maximum electric field intensity of part of a channel region near a drain region can be reduced as compared with the known semiconductor device. More particularly, the smaller the EOT of the gate dielectric 4 becomes, the more significantly the maximum electric field intensity can be reduced as compared with that of the known semiconductor device. The reason for this is that in this embodiment the third dielectric film 6 having a lower dielectric constant than the second dielectric film 3 is formed on an end portion of the channel region 10 which is near the drain region 9 and on which the electric field concentrates and under an end portion of the gate electrode 5 near the drain region 9.

As illustrated in FIG. 5, the leakage current during the OFF state of the semiconductor device according to the first embodiment (the present invention) can be reduced as compared with that of the known semiconductor device. More particularly, the smaller the EOT of the gate dielectric 4 becomes, the more significantly the leakage current can be reduced as compared with the known semiconductor device. The reason for this is that as illustrated in FIG. 4, the maximum electric field intensity of the semiconductor device according to this embodiment can be reduced in an end portion of the channel region 10 near the drain region 9. In this way, the leakage current is reduced as compared with that of the known semiconductor device, resulting in reduced power consumption.

As illustrated in FIG. 1, an end portion of the drain region 9 near the channel region 10 is preferably located below the gate electrode 5 and under one of the third dielectric films 6.

Figure 6:
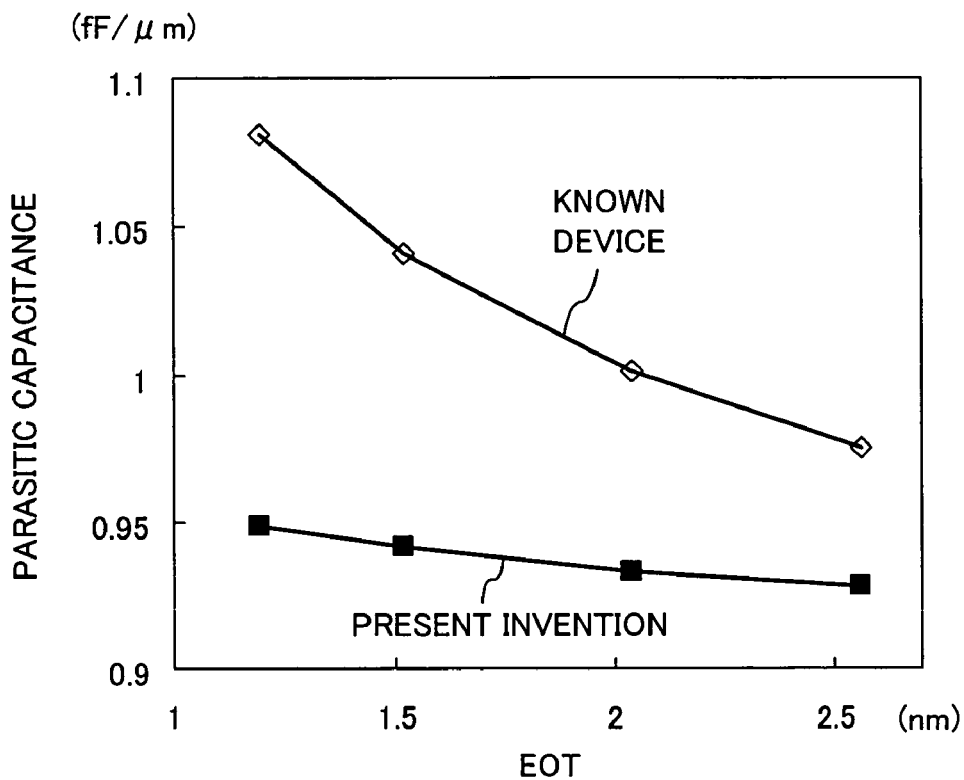
FIG. 6 is a graph obtained by simulating, in each of the semiconductor device of the first embodiment and a known semiconductor device, the relationship between the EOT thereof and the parasitic capacitance thereof.

FIG. 6 illustrates a result obtained by simulating, in each of the semiconductor device according to the first embodiment and the known semiconductor device, the relationship between the EOT of a gate dielectric and the parasitic capacitance. In FIG. 6, the parasitic capacitance represents the mean value of the parasitic capacitances of each transistor corresponding to the ON and OFF states thereof. The gate length is 75 nm, a first dielectric film has a thickness of 1 nm, and a second dielectric film has a thickness of 4 nm and different dielectric constants. The operating frequency of the transistor is 10 MHz, and voltages are applied to the transistor under the following conditions: When the transistor is in an OFF state, the gate voltage is 0 V and the drain voltage is 1 V; and when the transistor is in an ON state, the gate voltage is 1V and the drain voltage is 1 V. As illustrated in FIG. 6, in the semiconductor device according to the first embodiment (present invention), the parasitic capacitance can be reduced as compared with that of the known semiconductor device. More particularly, the smaller the EOT of a gate dielectric becomes, the more significantly the parasitic capacitance can be reduced as compared with the known semiconductor device. The reason for this is that in the semiconductor device of this embodiment, a part of the third dielectric film 6 having a lower permittivity than the second dielectric film 3 is formed under an end portion of the gate electrode 5 near the drain region 9.

In other words, since in the first embodiment a part of a third dielectric film 6 having a lower permittivity than a second dielectric film 3 of a high-dielectric-constant material formed above a channel region 10 is formed under an end portion of a gate electrode 5 near a drain region 9, the parasitic capacitance of the semiconductor device can be reduced. This can reduce the parasitic capacitance as compared with the known semiconductor device, resulting in an increase in the operation speed of the semiconductor device.

(Modification of Embodiment 1)

A modification of the first embodiment of the present invention will be described hereinafter with reference to the drawings.

Figure 7:
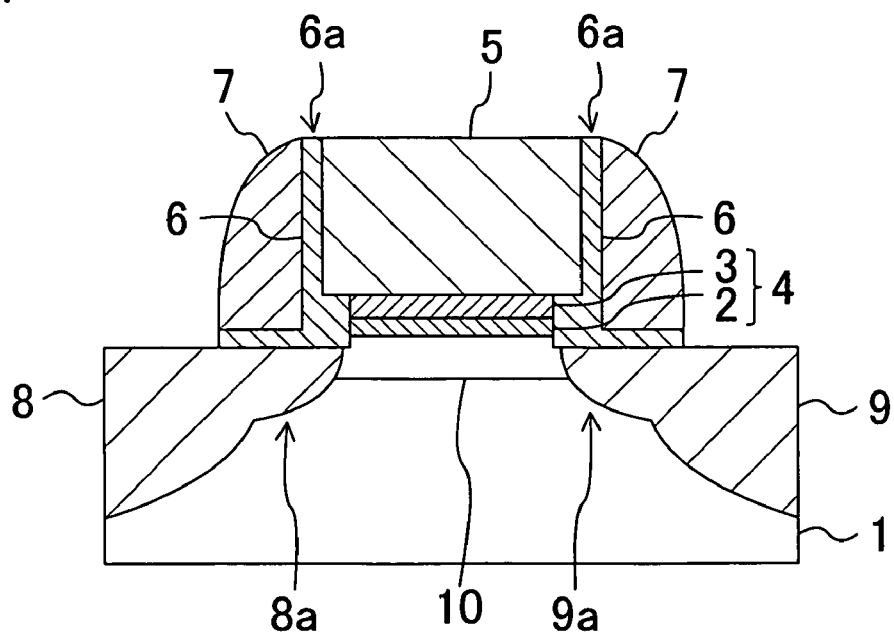
FIG. 7 is a cross-sectional view illustrating the structure of a semiconductor device according to a modification of the first embodiment of the present invention.

FIG. 7 is a cross-sectional view illustrating the structure of a semiconductor device according to a modification of the first embodiment of the present invention. In FIG. 7, the same reference numerals are given to the same components as in FIG. 1, and therefore a description thereof is not given.

As illustrated in FIG. 7, in this modification, respective parts of third dielectric films 6 having a lower permittivity than a second dielectric film 3 of a high-dielectric-constant material and located under both lateral end portions of a gate electrode 5 has a larger thickness than a gate dielectric 4. This can provide a higher degree of effectiveness than that provided by the first embodiment.

Figure 8:
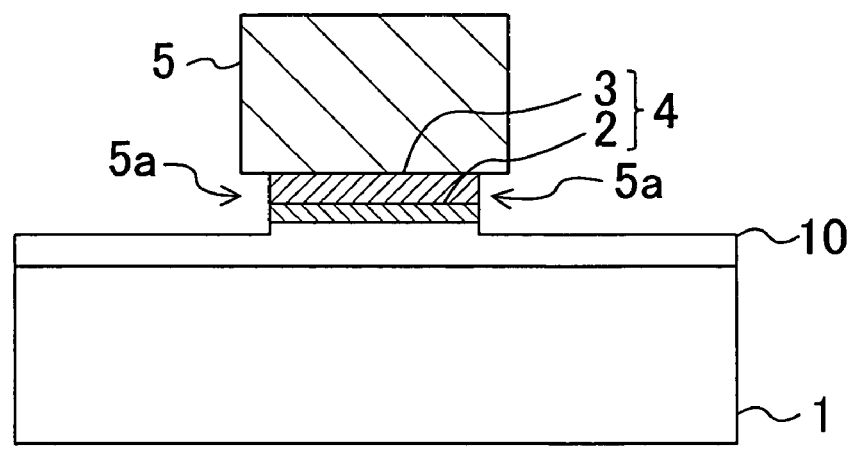
FIG. 8 is a cross-sectional view illustrating an essential process step in the fabrication method for a semiconductor device according to the modification of the first embodiment of the present invention.

A semiconductor device of this modification can be formed in the following manner: As illustrated in FIG. 8, a gate dielectric 4 is formed of a first dielectric film 2 and a second dielectric film 3 by etching using an aqueous solution containing hydrofluoric acid; and in the process step of forming gaps 5a under both end portions of the gate electrode 5 in the gate length direction, the upper part of the semiconductor substrate 1 is partly etched away to form recesses.

Embodiment 2

A second embodiment of the present invention will be described hereinafter with reference to the drawings.

Figure 9:
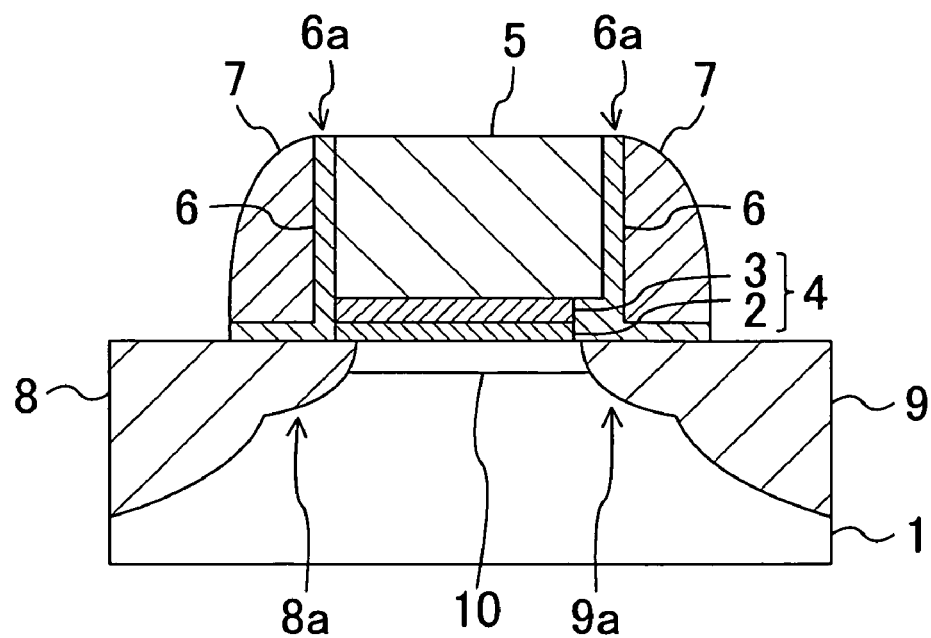
FIG. 9 is a cross-sectional view illustrating the structure of a semiconductor device according to a second embodiment of the present invention.

FIG. 9 is a cross-sectional view illustrating the structure of a semiconductor device according to the second embodiment of the present invention. In FIG. 9, the same reference numerals are given to the same components as in FIG. 1, and therefore a description thereof is not given.

Figure 12:
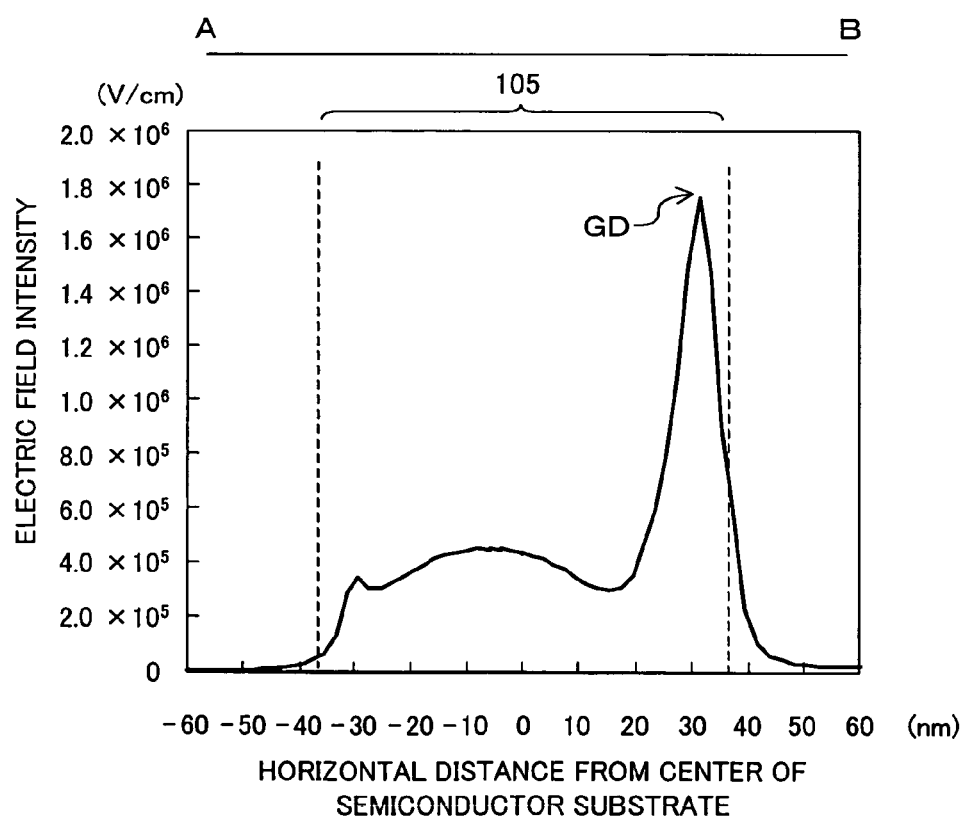
FIG. 12 is a graph obtained by simulating an electric field intensity distribution along the line A-B in FIG. 11.
Figure 13:
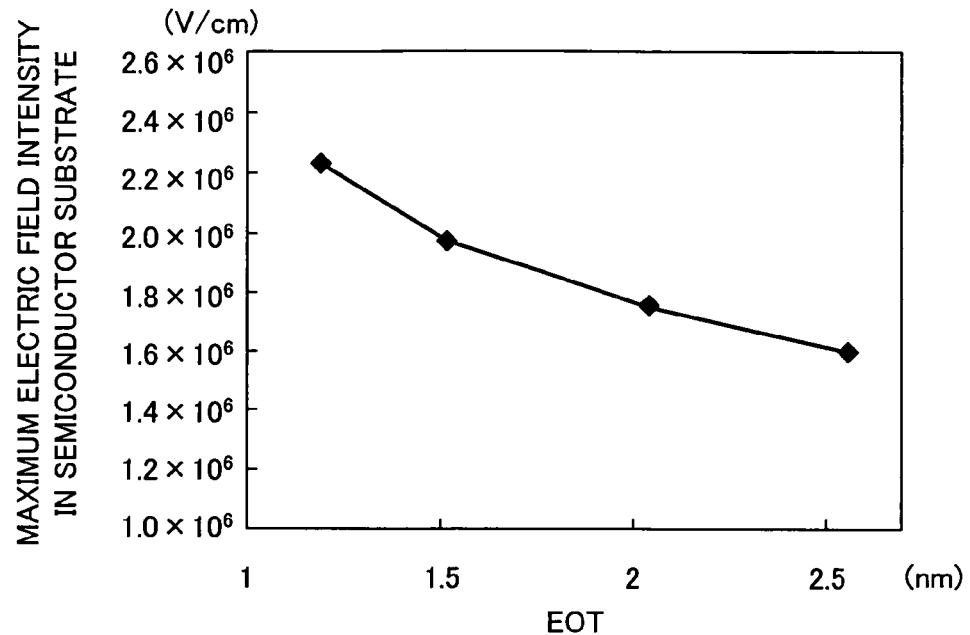
FIG. 13 is a graph obtained by simulating, in the known semiconductor device, the relationship between the EOT thereof and the maximum electric field intensity thereof in a semiconductor substrate.
Figure 14:
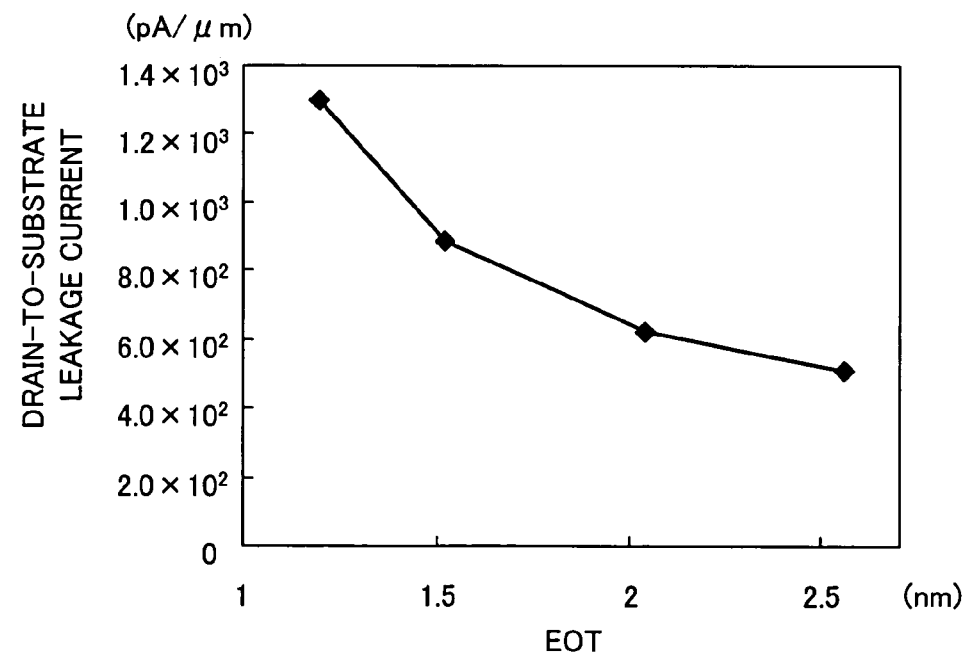
FIG. 14 is a graph obtained by simulating, in the known semiconductor device, the relationship between the EOT thereof and the drain-to-substrate leakage current thereof.
Figure 15:
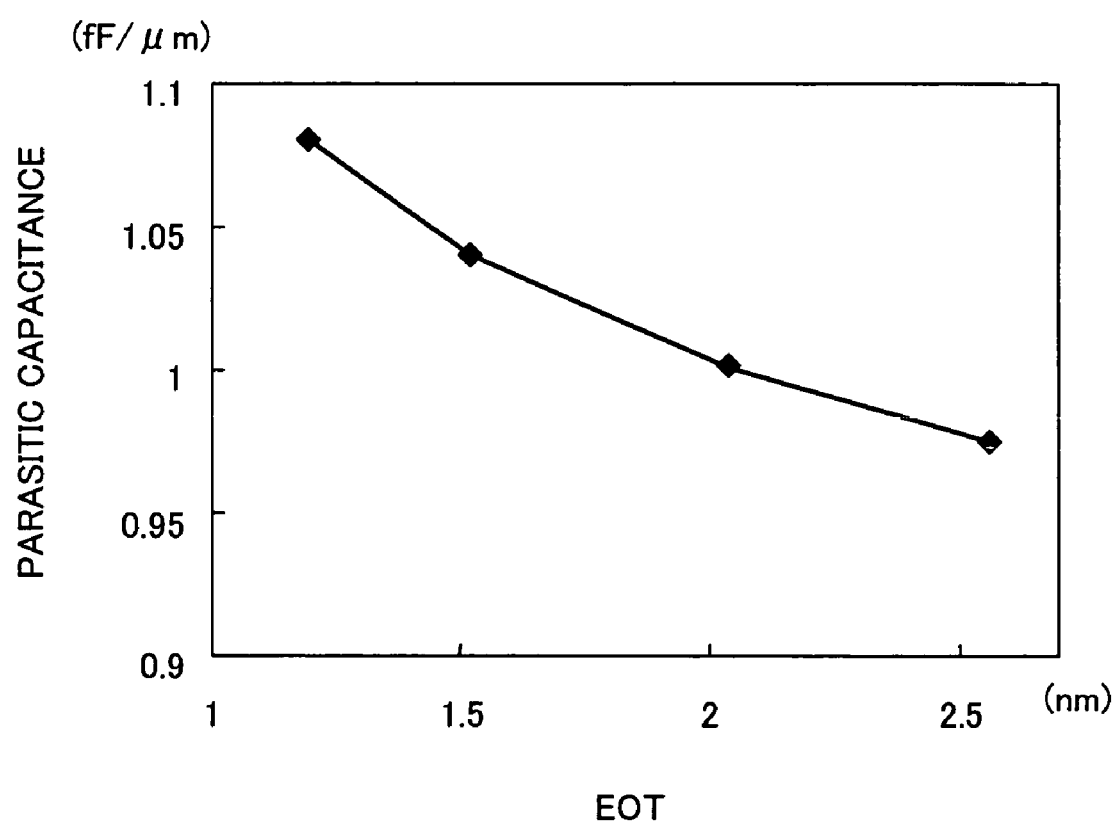
FIG. 15 is a graph obtained by simulating, in the known semiconductor device, the relationship between the EOT thereof and the parasitic capacitance thereof.

Since as illustrated in FIG. 12 an end portion of a channel region 10 near a drain region 9 has the highest electric field intensity, the semiconductor device of the second embodiment is characterized as follows: Only respective end portions of a first dielectric film 2 and a second dielectric film 3 near a drain region 9 are removed to form gaps 5a, and third dielectric films 6 having a lower permittivity than the second dielectric film 3 are formed in in the resultant gaps 5a.

A fabrication method for the semiconductor device formed as described above will be described hereinafter with reference to the drawings.

Figure 10A:
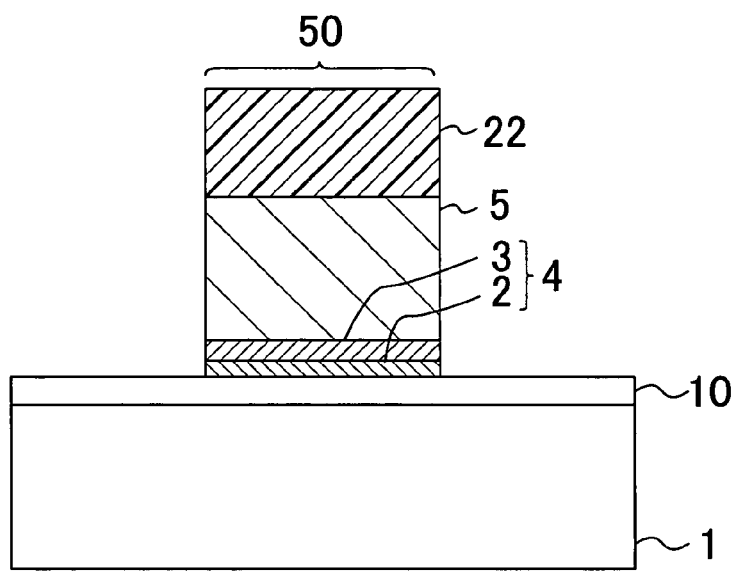
FIGS. 10A through 10C are cross-sectional views illustrating some of process steps in a fabrication method for a semiconductor device according to the second embodiment of the present invention.
Figure 10B:
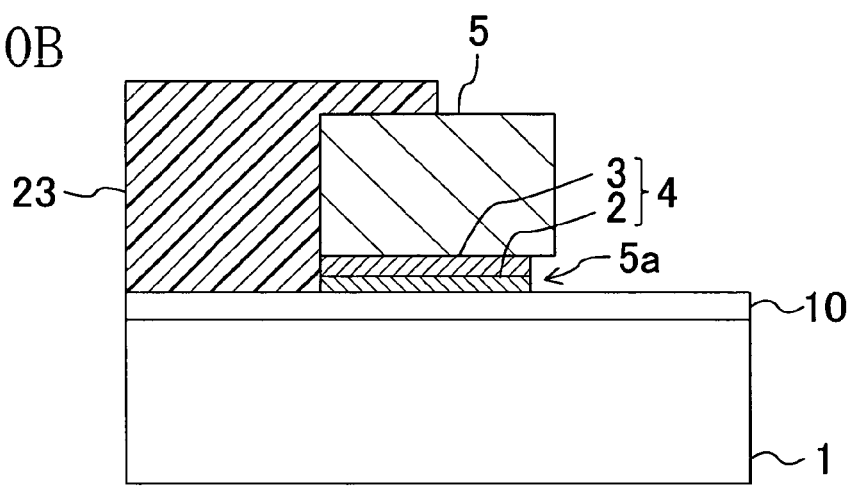
Figure 10C:
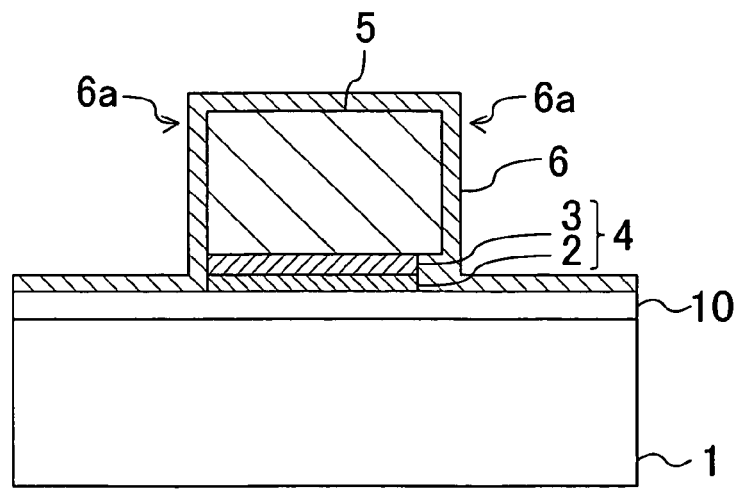
Figure 11:
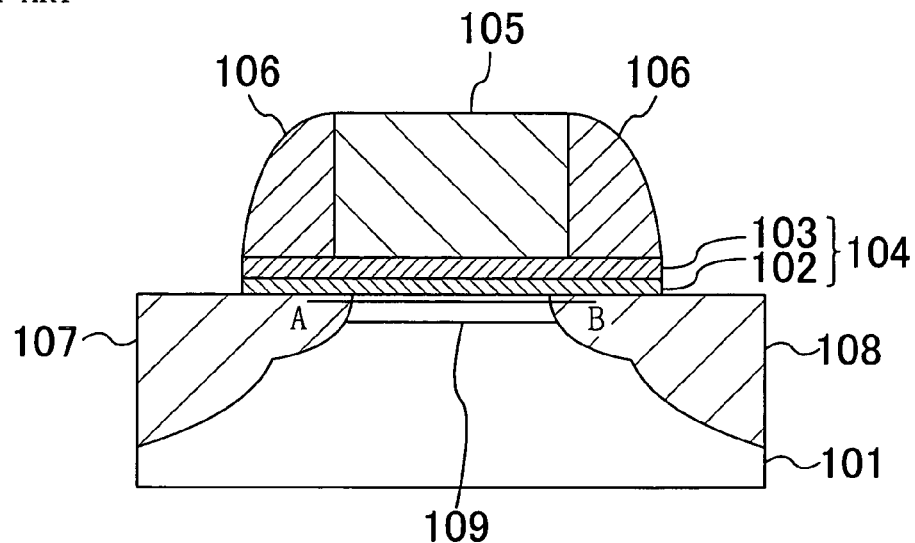
FIG. 11 is a cross-sectional view illustrating the structure of a known semiconductor device (MIS transistor).

FIGS. 10A through 10C are cross-sectional views illustrating process steps in a fabrication method for a semiconductor device according to the second embodiment of the present invention step by step.

First, as illustrated in FIG. 10A, like the fabrication method for the semiconductor device according to the first embodiment, a channel region 10 is formed in the top surface of a semiconductor substrate 1 by ion implantation. Subsequently, a 1-nm-thick first dielectric film 2 of silicon dioxide, a 4-nm-thick second dielectric film 3 of a high-dielectric-constant material, such as $HfO_2$, and a conductive film of doped polysilicon that will partly form a gate electrode are sequentially formed on the principal surface of the semiconductor substrate 1. Subsequently, a first resist pattern 22 is formed by lithography to cover a part of the conductive film corresponding to a gate formation region 50. Thereafter, dry etching using the formed first resist pattern 22 as a mask permits formation of a gate electrode 5 composed of the conductive film and a gate dielectric 4 composed of the first dielectric film 2 and the second dielectric film 3.

Next, as illustrated in FIG. 10B, the first resist pattern 22 is removed, then a resist material is again applied onto the entire substrate region to cover the gate electrode 5 and the semiconductor substrate 1, and a second resist pattern 23 is formed by lithography to have an opening for exposing a region of the semiconductor substrate 1 in which a drain is to be formed (hereinafter, referred to as "drain formation region") and an end portion of the gate electrode 5 near the drain formation region. Subsequently, an end portion of the gate dielectric 4 near the drain formation region is removed by isotropic wet etching using the formed second resist pattern 23 and the gate electrode 5 as etching masks and using an aqueous solution containing hydrofluoric acid. In this way, a gap 5a is formed between the end portion of the gate electrode 5 near the drain formation region and the semiconductor substrate 1 (channel region 10). In the above-mentioned manner, a gate dielectric 4 composed of the first dielectric film 2 and the second dielectric film 3 is formed under part of the gate electrode 5 by removing its end portion near the drain formation region.

Next, as illustrated in FIG. 10C, the second resist pattern 23 is removed, and then a 5-nm-thick third dielectric film 6 of silicon dioxide (HTO) is formed, for example, by thermal CVD at a temperature of approximately 700° C., to cover the top and side surfaces of the gate electrode 5, both lateral end surfaces of the gate dielectric 4 and the principal surface of the semiconductor substrate 1.

Thereafter, like the first embodiment, extension regions 8a and 9a are formed by ion implantation using, as masks, the gate electrode 5 and offset spacer films 6a which form parts of the third dielectric film 6 and are located on both sides of the gate electrode 5. Subsequently, insulative sidewalls 7 are formed with the third dielectric film 6 formed on both sides of the gate electrode 5 and interposed between the sidewalls 7 and the gate electrode 5. Then, a source region 8 and a drain region 9 are formed in the semiconductor substrate 1 by ion implantation using the gate electrode 5, the third dielectric film 6 (offset spacer films 6a) and the sidewalls 7 as masks. In this way, the semiconductor device according to the second embodiment as illustrated in FIG. 9 can be provided.

According to the second embodiment, a third dielectric film 6 having a lower dielectric constant than a second dielectric film 3 is formed only between an end portion of a channel region 10 which is near a drain region 9 and on which the electric field concentrates and an end portion of a gate electrode 5 near a drain region 9. Therefore, the same effect as in the first embodiment can be provided.

Furthermore, in the second embodiment, a second dielectric film 3 of a high-dielectric-constant material is left under an end portion of a gate electrode 5 near a source region 8. Therefore, the driving capability of a semiconductor device (transistor) becomes higher than that in the first embodiment.

Also in the second embodiment, like the modification of the first embodiment, in the process step illustrated in FIG. 10B, the upper part of a semiconductor substrate 1 may be partly etched away in formation of a gap 5a between an end portion of a gate electrode 5 near a drain formation region and the semiconductor substrate 1. Furthermore, the gate electrode 5 may be fully silicided (FUSI).

In the first embodiment, the modification thereof and the second embodiment, a gate dielectric 4 has a two-layer structure of a first dielectric film 2 of silicon dioxide and a third dielectric film 3 of a high-dielectric-constant material. However, it is not restricted to the two-layer structure. In other words, the gate dielectric 4 may have a single-layer structure of a high-dielectric-constant material or a multilayer structure of three or more layers including a layer made of a high-dielectric-constant material.

Although a silicon dioxide film formed by thermal oxidation is used as the first dielectric film 2, a silicon oxynitride (SiON) film formed by heat treatment in a nitrogen monoxide (NO) atmosphere or a dinitrogen monoxide ($N_2O$) atmosphere can be used instead.

Although a third dielectric film 6 of silicon dioxide is formed by thermal CVD, a third dielectric film 6 may be formed by oxidizing the entire substrate region, for example, using heat treatment in an oxidizing atmosphere at a temperature of approximately 800° C. A material of the third dielectric film 6 is not limited to silicon dioxide. As mentioned above, it is preferably a dielectric material containing silicon and at least one of nitrogen and oxygen, such as silicon oxynitride or silicon nitride.

A gap 5a formed between a lateral end portion of a gate electrode 5 and a semiconductor substrate 1 does not always need to be filled with a third dielectric film 6. The reason for this is that even if the whole gap 5a or part of the gap 5a were not filled, the permittivity of the gap 5a would only become lower than silicon dioxide or any other dielectric material.

As described above, the semiconductor device according to the present invention and the method for fabricating the same provide the effect of reducing the leakage current and the parasitic capacitance and are useful, in particular, as a semiconductor device having a MIS transistor using a high-dielectric-constant film for a gate dielectric and a method for fabricating the same.

What is claimed is:

1. A semiconductor device comprising:
a semiconductor substrate;
a first dielectric film formed on the semiconductor substrate;
a second dielectric film formed on the first dielectric film and having a higher permittivity than the first dielectric film;
a gate electrode formed on the second dielectric film, both end portions of the gate electrode in the gate length direction projecting out from the second dielectric film with an eave shape;
a third dielectric film formed between the both end portions of the gate electrode projecting out with an eave shape and the semiconductor substrate and having a lower permittivity than the second dielectric film;
a source region and a drain region formed in parts of the semiconductor substrate lateral to the gate electrode; and
a channel region formed in a part of the semiconductor substrate between the source region and the drain region,
wherein both end portions of the first dielectric film and the second dielectric film in the gate length direction are located at more inner positions than the both end portions of the gate electrode in the gate length direction,
the first dielectric film is formed so as to completely cover the lower surface of the second dielectric film,
the third dielectric film is made of silicon nitride, and
an extreme end of the source region located near the channel region and an extreme end of the drain region located near the channel region are located inwardly of both side surfaces of the gate electrode in the gate length direction and located outwardly of both side surfaces of the first dielectric film in the gate length direction.

2. The semiconductor device of claim 1, wherein a part of the semiconductor substrate located under the third dielectric film has a height lower than a height of another part of the semiconductor substrate located under the first dielectric film.

3. The semiconductor device of claim 1, wherein the third dielectric film is formed also on side surfaces of the gate electrode.

4. The semiconductor device of claim 1, further comprising sidewalls formed on side surfaces of the gate electrode, wherein the third dielectric film that is generally L-shaped is formed between the gate electrode and the sidewalls and between the sidewalls and the semiconductor substrate.

5. The semiconductor device of claim 1, further comprising sidewalls formed on side surfaces of the gate electrode, wherein the third dielectric film that is generally L-shaped is formed between the gate electrode and the sidewalls.

6. The semiconductor device of claim 1, wherein the first dielectric film and the third dielectric film are made of the same material.

7. The semiconductor device of claim 1, wherein the first dielectric film and the third dielectric film are made of different materials.

8. The semiconductor device of claim 1, wherein the first dielectric film is made of silicon dioxide.

9. The semiconductor device of claim 4, wherein a part of the third dielectric film located between the gate electrode and the semiconductor substrate has a thickness larger than a thickness of another part of the third dielectric film located between the sidewall and the semiconductor substrate.

10. The semiconductor device of claim 1, further comprising sidewalls formed on the side surfaces of the gate electrode, wherein the third dielectric film that is generally L-shaped is formed between the gate electrode and the sidewalls and between the sidewalls and the semiconductor substrate, a part of the semiconductor substrate located under the third dielectric film has a height lower than a height of another part of the semiconductor substrate located under the first dielectric film, and a part of the third dielectric film located between the gate electrode and the semiconductor substrate has a thickness larger than a thickness of another part of the third dielectric film located between the sidewall and the semiconductor substrate.

* * * * *